United States Patent
Bosshart (10) Patent No.: US 6,246,266 B1
(45) Date of Patent: Jun. 12, 2001

(54) DYNAMIC LOGIC CIRCUITS USING SELECTED TRANSISTORS CONNECTED TO ABSOLUTE VOLTAGES AND ADDITIONAL SELECTED TRANSISTORS CONNECTED TO SELECTIVELY DISABLED VOLTAGES

(75) Inventor: Patrick W. Bosshart, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/405,918

(22) Filed: Sep. 24, 1999

(51) Int. Cl.$^7$ .................................................. H03K 19/096
(52) U.S. Cl. ................................ 326/98; 326/95; 326/121
(58) Field of Search ................................ 326/93, 95, 98, 326/112, 119, 121

(56) References Cited

U.S. PATENT DOCUMENTS 5,712,826 * 1/1998 Wong et al. ......................... 365/226
5,821,778 * 10/1998 Bosshart ................................. 326/95

* cited by examiner

Primary Examiner—Michael Tokar
Assistant Examiner—Anh Tran
(74) Attorney, Agent, or Firm—Robert D. Marshall, Jr.; W. James Brady, III; Frederick J. Telecky, Jr.

(57) ABSTRACT

A dynamic logic circuit (16) operable in an active mode and in a power down mode, where the active mode comprises a precharge phase and an evaluate phase. The dynamic logic circuit comprises a precharge node ($18_{PN}$) coupled to be precharged to a precharge voltage ($V_{DD}$) during the precharge phase and operable to be discharged during the evaluate phase. The dynamic logic circuit further comprises a conditional series discharge path connected to the precharge node and comprising a plurality of transistors ($18_L$, $18_{DT}$, $20_{SDVN}$) operable to conditionally couple the precharge node to a voltage different than the precharge voltage. Further, the dynamic logic circuit comprises an output inverter ($18_{INV}$) having an input connected to the precharge node and comprising a plurality of transistors ($18_{INVP}$, $18_{INVN}$) for providing an output signal representative of a voltage at the precharge node during the evaluate phase. Still further, the dynamic logic circuit comprises a precharge transistor ($18_{PT}$) operable to be enabled during the power down mode and having a source/drain conductive path for coupling the precharge voltage to the precharge node during the precharge phase.

27 Claims, 2 Drawing Sheets

DYNAMIC LOGIC CIRCUITS USING SELECTED TRANSISTORS CONNECTED TO ABSOLUTE VOLTAGES AND ADDITIONAL SELECTED TRANSISTORS CONNECTED TO SELECTIVELY DISABLED VOLTAGES

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to transistor circuit configurations and are more particularly directed to dynamic logic circuits.

In many modern circuit applications, it is desirable to increase the operational speed of the circuit application. For example, in microprocessor design the circuits which make up speed-limiting portions or affect the speed of the microprocessor are constantly scrutinized and re-designed to increase the overall microprocessor speed. Increased speed increases performance and, therefore, permits more detailed and sophisticated processing capabilities in a shorter amount of time.

To increase the speed of microprocessors, as well as other circuits where speed is important, dynamic logic transistor circuits are currently used because they often provide increased speed as compared to static logic transistor circuits. A dynamic logic circuit is characterized by operating in two phases. First, a precharge node is set to a first potential during a precharge phase. Second, during an evaluate phase, if a logic condition represented by the circuit is satisfied, the precharged node is discharged, thereby changing the logic output of the circuit. In other words, at the conclusion of the precharge phase, the precharged node causes a first logic state to be output by the dynamic logic circuit and if the precharged node is discharged during the evaluate phase, the output of the dynamic logic gate represents a second logic state differing from the first logic state. The act of discharging to change states, when accomplished using one or more n-channel transistors to gate the transition from precharge to discharge, represents a speed increase over the prior operation of static circuits which in one instance accomplished a transition with a network of n-channel transistors while in another instance accomplished the opposite transition with a network of p-channel transistors.

Another performance technique currently in use in manufacturing is to target the threshold voltage of transistors given certain circuit expectations. Particularly, typically a manufacturer will build transistors, or make available transistor fabrication processes, which include transistors of a given threshold voltage. When providing this process, the manufacturer typically considers the tradeoff in speed improvement versus power consumption. To increase operational speed, it is known that the threshold voltage of all of the transistors within a circuit may be reduced. By reducing the threshold voltage, the drive current of these transistors is increased. However, the leakage current of those same transistors is also increased. Indeed, note that this approach becomes even more limiting as power supply voltages are reduced and the threshold voltage of the transistor becomes a greater percentage of the power supply voltage. Consequently, one approach is to lower the threshold voltage of the transistor but this increases current leakage and therefore also increases overall standby power consumption. Thus, often a manufacturer anticipates a certain level of leakage to be the acceptable limit, and in view of that limit, adjusts known parameters so that each of the transistors of the circuit share a designated threshold voltage which will provide that limit.

While the above approaches are representative of the art for advancing circuit operational speed, they provide various limitations or drawbacks. For example, the dynamic logic speed is still limited by the threshold voltage of the transistors used in the logic. As another example, an advance in speed by reducing threshold voltage typically increases standby power consumption caused by leakage current. The inventor of the present embodiments has recognized the above considerations and has provided various improvements in certain U.S. patents, where in those patents dynamic logic circuits are constructed using a combination of low threshold voltage transistors and high threshold voltage transistors. For example, U.S. Pat. No. 5,831,451, entitled "Dynamic logic circuits using transistors having differing threshold voltages," issued Nov. 3, 1998, and is hereby incorporated herein by reference. In U.S. Pat. No. 5,831,451, there is described a dynamic logic system whereby each discharge path in the system includes at least one high threshold voltage transistor for reducing current leakage during the precharge phase, and where preferably each such discharge path further includes one or more low threshold voltage transistors to increase the speed of operation of the circuit during the evaluate phase. As another example, U.S. Pat. No. 5,821,778, entitled "Using cascode transistors having low threshold voltages," issued Oct. 13, 1998, and is also hereby incorporated herein by reference. In U.S. Pat. No. 5,821,778, there is described a dynamic logic system whereby each discharge path in the system includes at least two low threshold voltage transistors to increase the speed of operation of the circuit during its evaluate phase, but where each of the two low threshold voltage transistors are known to be off during the precharge phase of operation and thereby to improve the leakage characteristics of those transistors and the circuit during that phase.

In addition to the preceding patents, the present inventor now further addresses various of the above-described considerations and drawbacks in the following embodiments, and thereby further improves on the state of the art.

BRIEF SUMMARY OF THE INVENTION

In one embodiment, there is a dynamic logic circuit coupled between an upper supply voltage and a lower supply voltage and operable in an active mode and in a power down mode, where the active mode comprises a precharge phase and an evaluate phase. The dynamic logic circuit comprises a precharge node coupled to be precharged to a precharge voltage during the precharge phase and operable to be discharged during the evaluate phase. The dynamic logic circuit further comprises a conditional series discharge path connected to the precharge node and comprising a plurality of transistors operable to conditionally couple the precharge node to a voltage different than the precharge voltage. Further, the dynamic logic circuit comprises an output inverter having an input connected to the precharge node and comprising a plurality of transistors for providing an output signal representative of a voltage at the precharge node during the evaluate phase. Still further, the dynamic logic circuit comprises a precharge transistor to be enabled during the power down mode and having a source/drain conductive path for coupling the precharge voltage to the precharge node during the precharge phase. Given the above, during the power down mode, at least one transistor in a first set of selected ones of the precharge transistor, the transistors of the conditional series path, and the transistors of the output inverter has a source/drain node connected to the upper supply voltage, and also during the power down mode, at least one transistor in a second set of selected ones of the precharge transistor, the transistors of the conditional series path, and the transistors of the output inverter has a source/drain node connected to the lower supply voltage, and lastly during the power down mode, at least one transistor in a third set of selected ones of the precharge transistor, the transistors of the conditional series path, and the transistors of the output inverter has a source/drain node selectively disabled from either of the upper supply voltage and the lower supply voltage. Other circuits, systems, and methods are also disclosed and claimed.

BRIEF DESCRIPTION OF THE SEVERAL VIEWS OF THE DRAWING

FIG. 1b illustrates a timing diagram of the prior art dynamic logic circuit of FIG. 1a;

DETAILED DESCRIPTION OF THE INVENTION

Figure 1A:
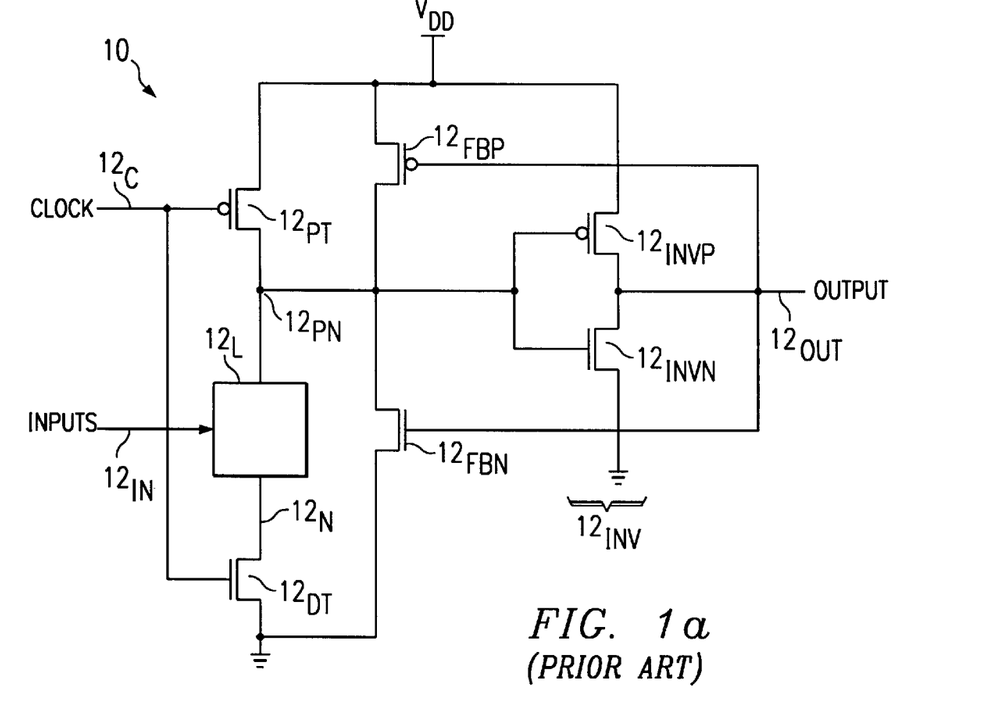
FIG. 1a illustrates a schematic of a prior art dynamic logic circuit.

By way of further introduction to the preferred embodiments discussed later, FIG. 1a illustrates a schematic of a prior art dynamic logic system designated generally at 10, and which in the art is sometimes referred to as a hold time latch. System 10 includes a precharge transistor $12_{PT}$, a precharge node $12_{PN}$, an output inverter $12_{INV}$, and a discharge path including both a logic circuit $12_L$ and a discharge transistor $12_{DT}$. Further, system 10 includes a conductor $12_C$ for receiving a CLOCK signal. The CLOCK signal is connected to the gate of precharge transistor $12_{PT}$ and to the gate of discharge transistor $12_{DT}$. Lastly, system 10 includes an input $12_{IN}$ for receiving one or more INPUTS and an output $12_{OUT}$ for providing an OUTPUT signal in response to the value of the INPUTS.

With respect to the input-related connections of system 10, precharge transistor $12_{PT}$, is a p-channel transistor which is typically smaller than the n-channel transistors shown in FIG. 1a. Precharge transistor $12_{PT}$ has a source connected to a source of the system voltage level (e.g., $V_{DD}$) and a drain connected to precharge node $12_{PN}$. As noted above, the CLOCK signal is connected to the gate of precharge transistor $12_{PT}$. Discharge transistor $12_{DT}$ is an n-channel transistor having its source connected to a low reference voltage (e.g., ground), its drain connected to a node $12_N$, and its gate connected to receive the CLOCK signal. Between precharge node $12_{PN}$ and node $12_N$ is connected a logic circuit $12_L$. The particular logic of logic circuit $12_L$ may implement any type of logic equation. For example, often logic circuit $12_L$ includes numerous transistors connected in various fashions to implement a logic equation, and the logic function of that equation is determined based on the particular transistor configuration as well as the respective input signals connected to the gates of those transistors. For purposes of the present discussion, the particular logic equation and inputs are not important and, thus, the word INPUTS is generally shown with it understood that such signals may come from any of various other circuits, being static, dynamnic, or both. What is noteworthy, however, is that once the logic equation formed by logic circuit $12_L$, is true, a conductive path is formed through logic circuit $12_L$ connecting precharge node $12_{PN}$ to node $12_N$. Further, recall that the CLOCK signal is connected to the gate of discharge transistor $12_{DT}$. Thus, when the CLOCK is high, discharge transistor $12_{DT}$ is also conducting, and if this occurs while the logic equation implemented by logic circuit $12_L$ is true, then a discharge path is created from precharge node $12_{PN}$, through logic circuit $12_L$ and discharge transistor $12_{DT}$, to ground such that the precharge voltage (i.e., $V_{DD}$) at precharge node $12_{PN}$ is permitted to discharge to ground.

Looking now to the output-related connections of system 10, precharge node $12_{PN}$ is further connected to the input of output inverter $12_{INV}$. Output inverter $12_{INV}$ includes a p-channel transistor $12_{INVP}$ and an n-channel transistor $12_{INVN}$. More particularly, the source of p-channel transistor $12_{INVP}$ is connected to $V_{DD}$), the drain of p-channel transistor $12_{INVP}$ is connected to output $12_{OUT}$, and the gate of p-channel transistor $12_{INVP}$ is connected to the input of inverter $12_{INV}$ and, hence, to precharge node $12_{PN}$. Similarly, the source of n-channel transistor $12_{INVN}$ is connected to ground, the drain of n-channel transistor $12_{INVN}$ is connected to output $12_{OUT}$, and the gate of n-channel transistor $12_{INVN}$ is also connected to the input of inverter $12_{INV}$. The output of output inverter $12_{INV}$ provides the output signal for system 10 (i.e., the result of the logic equation of logic circuit $12_L$). A p-channel feedback transistor $12_{FBP}$ is connected in a feedback manner from the output of inverter $12_{INV}$ to its input; more particularly, the gate of feedback transistor $12_{FBP}$ is connected to the output of inverter $12_{INV}$. The source of feedback transistor $12_{FBP}$ is connected to $V_{DD}$, and the drain of the feedback transistor $12_{FBP}$ is connected to the input of inverter $12_{INV}$. One skilled in the art will therefore appreciate that once the precharge voltage is no longer connected to a given precharge node in FIG. 1a (e.g., during the evaluate phase described below), the feedback p-channel transistor will maintain a high signal at the input of the inverter so long as the precharge node is not discharged by its corresponding discharge path. In some instances, an n-channel feedback transistor $12_{FBN}$ is also connected in a feedback manner from the output of inverter $12_{INV}$ to its input; more particularly, the gate of feedback transistor $12_{FBN}$ is connected to the output of inverter $12_{INV}$ the source of feedback transistor $12_{FBN}$ is connected to ground, and the drain of the feedback transistor $12_{FBN}$ is connected to the input of inverter $12_{INV}$. This additional n-channel feedback transistor is included in cases where one or more of the INPUTS are not in phase with system 10; in this instance, if an input signal first enables logic circuit $12_L$ to conduct but then that signal is no longer enabling during the evaluate phase, feedback n-channel transistor $12_{FBN}$ will maintain a low signal at the input of the inverter until precharge node $12_{PN}$ is once again precharged by enabling precharge transistor $12_{PT}$. Further in this regard, note that the term "enable" (and variations thereof) is known in the art and is used in this manner in the present document, where the term indicates that the gate potential to the transistor is sufficient to cause conduction along the conductive path (i.e., the source/drain) of the transistor to which the gate potential is connected. Similarly, in the present document the term "disabled" (and variations thereof) is used in opposite fashion to indicate that the gate potential to the transistor is insufficient to cause conduction along the conductive path of the transistor(s).

Figure 1B:
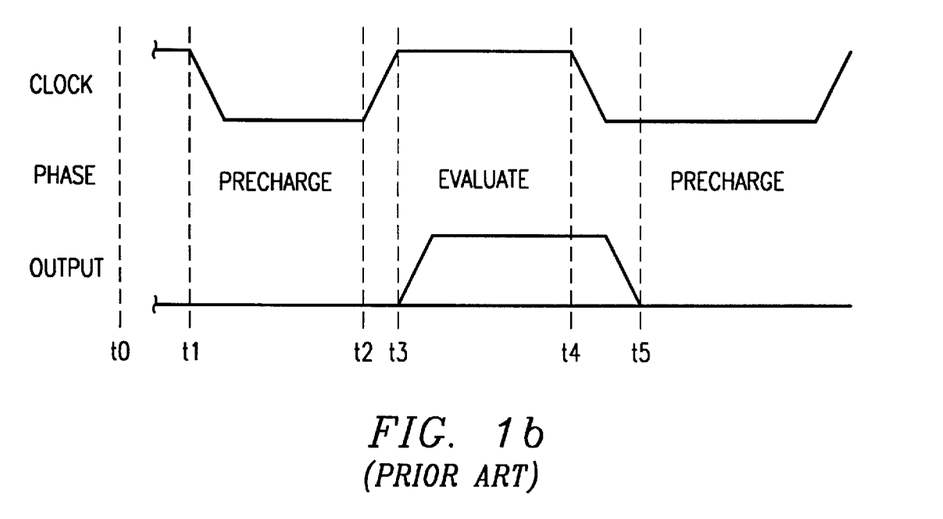

The operation of system 10 is understood with reference to the prior art timing diagram of FIG. 1b, and first is presented an introduction to its signal rows which are discussed from top to bottom, followed by a detailed analysis of the operation depicted by those signals. The top row of FIG. 1b merely shows the state of the CLOCK signal, since that signal is used to control the gates of precharge transistor 12$_{PT}$ and discharge transistor 12$_{DT}$. The middle row shows the state of the phase of the circuit in response to the CLOCK signal. Lastly, the bottom row of FIG. 1b depicts the data value output by system 10 at its output 12$_{OUT}$.

Looking to the specific signals of FIG. 1b, assume by a time t0 that system 10 is running at a steady-state and between t0 and t1, the CLOCK signal is high. To simplify the discussion, the remaining signals are not detailed during this time but are instead examined after t1 from which one skilled in the art will appreciate how the same transitions may precede t1. Looking to t1, at that time the CLOCK signal transitions from high to low. As a result of the low CLOCK signal, system 10 is in a precharge phase of operation. More specifically, the low CLOCK signal is applied to the gates of p-channel precharge transistor 12$_{PT}$ and n-channel discharge transistor 12$_{DT}$. In response and due to the conductivity types of these transistors, this enables precharge transistor 12$_{PT}$ (i.e., causes it to conduct) and disables discharge transistor 12$_{DT}$ (i.e., causes it to not conduct). The conduction of precharge transistor 12$_{PT}$ causes precharge node 12$_{PN}$ to rise to $V_{DD}$ and this signal is inverted by output inverter 12$_{INV}$, thereby causing the output of system 10 (i.e., bottom row of FIG. 1b) to be a logic low between t1 and t2.

At time t2, the CLOCK signal begins a transition from low to high, and reaches its high value by t3. As a result of the high CLOCK signal, system 10 is in an evaluate phase of operation. Particularly, the high CLOCK signal disables precharge transistor 12$_{PT}$ and enables discharge transistor 12$_{DT}$. The conduction of discharge transistor 12$_{DT}$ connects node 12$_N$ to ground; accordingly, if during this time the logic equation realized by logic circuit 12$_L$ is true, then a complete discharge path is created from precharge node 12$_{PN}$ to ground. In other words, a conditional discharge path exists between precharge node 12$_{PN}$ and ground, whereby satisfaction of the above-described conditions completes the path and, thus, the voltage at precharge node 12$_{PN}$ falls to ground. This ground signal is inverted by output inverter 12$_{INV}$, thereby causing the output of system 10 to be a logic high from some delay time after t3 and at least until t4. Alternatively, if the logic equation of circuit 12$_L$ is not true during the evaluate phase, then the output of system 10 remains low between t3 and t4.

At t4, again the CLOCK signal transitions from high to low and thereby places system 10 in a precharge phase of operation. Immediately after t4, note that there will be some delay built into the system before precharge node 12$_{PN}$ rises and inverter 12$_{INV}$ inverts that rising voltage; in other words, immediately after t4, the output of system 10 remains high. This period is sometimes referred to in the art as a hold time, meaning the output remains briefly held valid. Due to this operation, a subsequent dynamic logic stage or stages may be triggered in response to this valid output during the hold time. In any event, by t5 this hold time expires and the output of system 10 returns to a low level.

Given the preceding, note as a matter of conclusion of the prior art discussion that a hold time latch is only one type of domino logic circuit, where for the hold time latch its inputs may remain valid only temporarily during its evaluate phase. However, other types of dynamic logic circuits also exist in the art. Accordingly, it should be noted that system 10 is only provided by way of example as to dynamic logic in general, and this example is not intended to be limiting as to the inventive scope described below.

Figure 2:
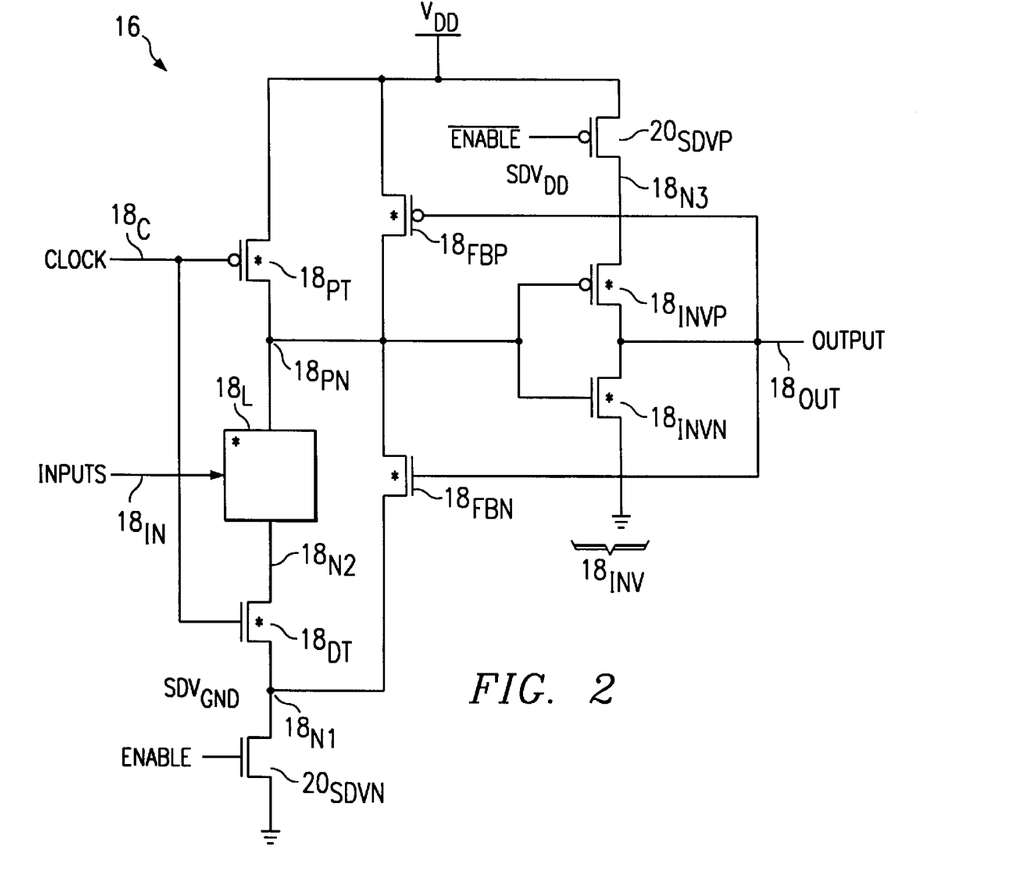
FIG. 2 illustrates a schematic of an inventive dynamic logic circuit having selected transistors connected to absolute voltages and additional selected transistors connected to selectively disabled voltages, where different ones of the transistors have different threshold voltages.

Having now detailed the prior art, FIG. 2 illustrates a schematic of an inventive dynamic logic system designated generally at 16, which also operates as a hold time latch and provides one type of dynamic logic circuit in which the present inventive teachings may be employed. For reasons detailed below, note that some of the devices in system 16 are connected in a comparable manner to those in system 10; however, additional devices are included, device attributes are adjusted, and the speed of the circuit as well as its leakage current characteristics are quite different. To simplify the following discussion, the devices in general are first described and thereafter is presented a focused discussion of the circuit changes and performance improvements over the prior art.

Turning to the devices and connections in system 16, system 16 includes a precharge transistor 18$_{PT}$, a precharge node 18$_{PN}$, an output inverter 18$_{INV}$, and a discharge path including both a logic circuit 18$_L$ and a discharge transistor 18$_{DT}$. The discharge path also includes a transistor 20$_{SDVN}$, where the subscript denotes its function which is detailed later as a selectively disabling voltage ("SDV") transistor, as well as its preferred conductivity type (i.e., n-channel). System 16 includes a conductor 18$_c$ for receiving a CLOCK signal. The CLOCK signal is connected to the gate of precharge transistor 18$_{PT}$ and to the gate of discharge transistor 18$_{DT}$. Lastly, system 16 includes an input 18$_{IN}$ for receiving one or more INPUTS and an output 18$_{OUT}$ for providing an OUTPUT signal in response to the value of the INPUTS.

With respect to the input-related connections of system 16, precharge transistor 18$_{PT}$ is preferably a p-channel having its source connected to a source of the system voltage level (e.g., $V_{DD}$), its drain connected to precharge node 18$_{PN}$, and its gate connected to receive the CLOCK signal. Discharge transistor 18$_{DT}$ is preferably an n-channel transistor having its source connected to a node 18$_{N1}$, its drain connected to a node 18$_{N2}$, and its gate connected to receive the CLOCK signal. Between precharge node 18$_{PN}$ and node 18$_{N2}$ is connected a logic circuit 18$_L$. The particular logic of logic circuit 18$_L$ may implement any type of logic equation (s), using for example numerous transistors connected in various fashions to implement a logic equation based on the particular transistor configuration as well as the respective input signals connected to the gates of those transistors. The particular logic equation and inputs are not important for understanding the preferred embodiments and, thus, the word INPUTS is generally shown with it understood that such signals may come from any of various other circuits, being static, dynamic, or both. Once a logic equation formed by logic circuit 18$_L$ is true, a conductive path is formed through logic circuit 18$_L$ connecting precharge node 18$_{PN}$ to node 18$_{N2}$.

Looking now to the output-related connections of system 16, precharge node 18$_{PN}$ is further connected to the input of output inverter $18_{INV}$. Output inverter $18_{INV}$ includes a p-channel transistor $18_{INVP}$ and an n-channel transistor $18_{INVN}$, where the gates of these two transistors are connected and form the input of inverter $18_{INV}$, the drains of these two transistors are connected and form the output of inverter $18_{INV}$, and the source of n-channel transistor $18_{INVN}$ is connected to ground while the source of p-channel transistor $18_{INVP}$ is connected to a node $18_{N3}$. Node $18_{N3}$ is further connected to the drain of a transistor $20_{SDVP}$, where here the subscript again denotes a selectively disabling voltage ("SDV") transistor, as well as the preferred conductivity type for the transistor (i.e., p-channel). Returning to the output of output inverter $18_{INV}$, it provides the output signal for system 16, and is also preferably connected to two feedback transistors. Specifically, a p-channel feedback transistor $18_{FBP}$ is connected such that its gate is connected to the output of inverter $18_{INV}$, its source is connected to $V_{DD}$, and its drain is connected to the input of inverter $18_{INV}$. Additionally, an n-channel feedback transistor $18_{FBN}$ is connected such that its gate is connected to the output of inverter $18_{INV}$ and its drain is connected to the input of inverter $18_{INV}$. For reasons detailed below, however, the source of n-channel feedback transistor $18_{FBN}$ is preferably connected to node $18_{N1}$ and not directly to ground. Further, note that n-channel feedback transistor $18_{FBN}$ is preferable when one or more of the INPUTS may be driven by a circuit out of phase with respect to system 16. As in the prior art, this additional n-channel transistor will maintain a low signal at the input of inverter $18_{INV}$ in instances where precharge node $18_{PN}$ is discharged during the evaluate phase and during that same phase an INPUT does not remain enabling.

Reference is now made to a key difference between system 16 and the prior art; specifically, note that asterisks are shown by various transistors in system 16, but not by other transistors in the same system. For example with respect to n-channel transistors, asterisks are shown by n-channel transistors $18_{DT}$ and $18_{INVN}$, and an asterisk is shown within logic circuit $18_L$ which preferably includes one or more n-channel transistors; however, an asterisk is not shown by n-channel transistor $20_{SDVN}$. In the preferred embodiment, the threshold voltage of the asterisk-identified transistors is lower than that of the same conductivity type transistor(s) that are not marked with an asterisk. Thus, the threshold voltage of n-channel transistors $18_{DT}$, $18_{INVN}$, and those within logic circuit $18_L$, is lower than the threshold voltage of n-channel transistor $20_{SDVN}$. Similarly with respect to the p-channel transistors, the threshold voltage of asterisk-identified transistors $18_{PT}$, $18_{FBP}$, and $18_{INVP}$ is lower than the threshold voltage of p-channel transistor $20_{SDVP}$ which is not identified by an asterisk. Lastly, note that the above-described distinction of mixed threshold voltage transistors is in stark contrast to the prior art, where each of the transistors of a configuration such as in FIG. 1a were constructed to have, and by definition must have had, the same high threshold voltage (i.e., to avoid the unacceptably large leakage current which would exist if a lower threshold voltage were used).

Before detailing the significance of the use of a low threshold voltage transistor versus a high threshold voltage transistor as implemented in system 16, note that these terms are used to designate the relative values of one transistor's threshold voltage versus another transistor's threshold voltage and are not necessarily limiting those terms to certain absolute values. Particularly, it is known in the art that a transistor's threshold voltage may be determined by measuring its current-voltage characteristics to determine a gate-to-source voltage where the transistor conducts a small amount of current. To demonstrate the relative nature of threshold voltages, consider the following. For a first transistor with a first threshold voltage, it will provide a first amount of drive current at a given drain-to-source voltage (with its gate connected to its drain). For a second transistor with a second threshold voltage lower than that of the first transistor, the second transistor will provide a second amount of drive current at the given drain-to-source voltage (with its gate connected to its drain), and which drive current is larger than the first amount of drive current provided by the first transistor at that same drain-to-source voltage. For the remainder of this document, a transistor of the first type will be referred to as an HVT transistor (i.e., a transistor with a relatively high threshold voltage) while a transistor of the second type will be referred to as an LVT transistor (i.e., a transistor with a relatively low threshold voltage). Further, note that an HVT transistor preferably has a threshold voltage on the order of that for transistors which are now used throughout a circuit where all transistors share the same threshold voltage, and where that threshold voltage was determined to be high enough to avoid unacceptably large leakage currents. Note also that although an LVT transistor provides the benefit of a higher drive current as opposed to an HVT transistor, in contrast it gives rise to the detriment that it provides a greater leakage current than an HVT transistor. Indeed, the typical leaking by an LVT transistor may be greater than that of an HVT transistor by two or three orders of magnitude or more.

Returning to system 16, in the preferred embodiment it may operate in two different modes, one being a power down mode, and another being an active mode. The names of these modes describe examples of their intended use. For example, the power down mode may be used in instances where the circuit will not be used for some period of time and, thus, it is desirable to place the circuit in a state to reduce its power consumption. Conversely, the active mode may be used where the circuit is required to perform its logical analyses. In either case, the selection of each mode is achieved in part via the ENABLE signal. More particularly, when ENABLE is de-asserted system 16 is in its power down mode; also during the power down mode, the CLOCK signal is enabling to precharge transistor $18_{PT}$ and disabling to discharge transistor $18_{DT}$ (i.e., low in the current example). When ENABLE is asserted system 16 is in its active mode, and the CLOCK signal transitions high and low at the power supply rail voltages (e.g., $V_{DD}$ and ground, respectively) to cause alternating precharge and evaluate phases. Each of these modes is detailed separately, below, and further detail is also provided later with respect to the ENABLE signal.

Looking first to the power down mode, recall that ENABLE is de-asserted. As a result, this signal state disables the two transistors having their gates connected to that signal, namely, transistors $20_{SDVN}$ and $20_{SDVP}$. At this point, therefore, the nodes connected to the drains of those transistors are selectively disabled from the voltage connected to the sources of those transistors, respectively. For example, with respect to transistor $20_{SDVN}$, when it is disabled the ground potential at its source is selectively disabled from reaching its drain which is connected to node $18_{N1}$. It is for this reason that transistor $20_{SDVN}$ was earlier introduced as a selectively disabling voltage transistor. Further, for this same reason, the potential at node $18_{N1}$ is labeled as $SDV_{GND}$ to indicate that node $18_{N1}$ has a voltage of ground when transistor $20_{SDVN}$ is enabled, but that same voltage is selectively disabled when transistor $20_{SDVN}$ is disabled.

Similar observations may be made with respect to transistor $20_{SDVP}$. Specifically, when transistor $20_{SDVP}$ is disabled the $V_{DD}$ potential at its source is selectively disabled from reaching its drain which is connected to node $18_{N3}$. Accordingly, the potential at node $18_{N3}$ is labeled as $SDV_{DD}$ to indicate that node $18_{N3}$ has a voltage of $V_{DD}$ when transistor $20_{SDVP}$ is enabled, but that same voltage is selectively disabled when transistor $20_{SDVP}$ is disabled. The effect and benefits of selectively disabling these voltages are explored below.

The effect and benefits of selectively disabling transistor $20_{SDVN}$ give rise to two considerations. As a first consideration, note that because transistor $20_{SDVN}$ is an HVT transistor, it has a lower leakage current when off (as opposed to an LVT transistor). Accordingly, when transistor $20_{DVN}$ is disabled it provides a limit to how much current can leak from precharge node $18_{PN}$, through n-channel transistor $18_{DT}$ and logic circuit $18_L$ to ground. Consequently, even though the discharge path contains some LVT transistors, the amount of possible leakage current is limited by the HVT transistor $20_{SDVN}$ during the power down mode. As a second consideration, note that the discharge path from precharge node $18_{PN}$ to ground includes transistor $20_{SDVN}$ as well as an LVT transistor that is known to be off in the power down mode; in the current example, this LVT transistor is discharge transistor $18_{DT}$. Specifically, recall it was stated earlier that the CLOCK signal is disabling to discharge transistor $18_{DT}$ during the power down mode and, therefore, discharge transistor $18_{DT}$ is known to be off during the power down mode. Further, since HVT transistor $20_{SDVN}$ is disabled during the power down mode, then the voltage at node $18_{N1}$ (i.e., $SDV_{GND}$) will begin to float upward from ground. Note further how this floating voltage affects the LVT transistor known to be off (i.e., discharge transistor $18_{DT}$). Specifically, due to the connections of system 16, the gate potential of discharge transistor $18_{DT}$ during the power down mode is fixed at an absolute voltage by the low CLOCK signal, namely, ground. Consequently, the floating potential at node $18_{N1}$ will then rise as described above. As this floating potential rises, then the gate-to-source voltage (i.e., $V_{GS}$) of discharge transistor $18_{DT}$ becomes negative. As known in the art, a negative $V_{GS}$ as applied to an n-channel transistor tends to further shut off the transistor, that is, it further restricts the amount of current that the transistor can pass (or leak, as the case may be). Accordingly, the upward floating potential at node $18_{N1}$ in combination with the fixed voltage at the gate of discharge transistor $18_{DT}$ further reduces the leakage of discharge transistor $18_{DT}$, even though it is an LVT transistor. Indeed, as the floating potential rises on the order of a few hundred millivolts, or the approximate difference in the threshold voltages of transistors $20_{SDVN}$ and $18_{DT}$, then the leakage of the LVT transistor $18_{DT}$ is reduced to approximately that of the HVT transistor $20_{SDVN}$ and, at that point, the potential at node $18_{N1}$ will reach a stable voltage.

The second consideration stated in the preceding paragraph may be appreciated further by contrasting it with logic circuitry prior art. For example, in U.S. Pat. No. 5,594,371, issued Jan. 14, 1997, and entitled "low voltage SOI (silicon on insulator) logic circuit," there is shown a system whereby a power reduced mode is achieved by completely disconnecting all transistors in a circuit from one or both of the circuit's supplies (i.e., either or both of ground and $V_{DD}$). To achieve this operation, the prior art adds a so-called power transistor between $V_{DD}$ and nodes that were previously connected directly to the $V_{DD}$, and/or by adding a power transistor between ground and nodes that were previously connected directly to ground. If, for the sake of argument but without admission, such an approach were applied to a dynamic logic circuit of the type shown in FIG. 1a, then the result would be to disconnect the source of discharge transistor $12_{DT}$ from ground during the reduced power mode, thereby allowing it to float. However, at the same time, the gate of that discharge transistor $12_{DT}$ also would float, unlike the preferred embodiment described above. Consequently, in this theoretical application of the prior art, both the gate and source potential would float identically, and the amount of leakage would be unaffected and, hence, the transistor would leak considerably.

Having detailed the effects and benefits of transistors $20_{SDVN}$ and $20_{SDVP}$, note that FIG. 2 illustrates these transistors only in connection with a single dynamic logic circuit to simplify the discussion. In a preferred implementation, these devices and their selective disabling operation provided by these transistors is shared with numerous other dynamic logic stages. Indeed, the selective disabling transistors may be used with dynamic logic stages that are out of phase with respect to one another. In any event, using the same selective disabling transistors for different stages provides an efficiency over duplicating such transistors for each stage. For example, based on the different stages coupled to the selectively disabled potential provided by a single selective disabling transistor, an average current that must be supported for all stages can be determined and then the single transistor can be designed with this determination as a consideration. Accordingly, higher and lower demands of individual stages or groups of stages can be averaged into the support provided by a single selectively disabling transistor and without having to customize different an duplicate selectively disabling transistors.

As another inventive aspect of system 16, note that the path from $V_{DD}$, to output $18_{OUT}$ also includes both a selectively disabling voltage transistor and an LVT transistor that is known to be off in the power down mode. Specifically, this path includes transistor $20_{SDVP}$ and p-channel transistor $18_{INVP}$. Transistor $18_{INVP}$ is known to be off during the power down mode because that mode is defined to occur when precharge transistor $18_{PT}$ is enabled, which thereby disables transistor $18_{INVP}$. Further, since HVT transistor $20_{SDVP}$ is disabled during the power down mode, then the voltage at node $18_{N3}$ (i.e., $SDV_{DD}$) will begin to float downward from $V_{DD}$. Note how this floating voltage affects the LVT transistor known to be off (i.e., transistor $18_{INVP}$). Specifically, the gate potential of transistor $18_{INVP}$ during the power down mode is fixed at an absolute voltage, namely, $V_{DD}$, and the floating potential at node $18_{N3}$ will then fall as described above. As this floating potential falls, then the $V_{GS}$ of transistor $18_{INVP}$ becomes positive. Here, because transistor $18_{INVP}$ is a p-channel transistor, and because it is known in the art that a more positive $V_{GS}$ as applied to a p-channel transistor reduces the amount of current that the transistor will pass, then the positive $V_{GS}$ tends to reduced the amount of current that the transistor will leak. Accordingly, the downward floating potential at node $18_{N3}$ in combination with the fixed voltage at the gate of transistor $18_{INVP}$ further decreases the tendency of discharge transistor $18_{INVP}$ to leak, even though it is an LVT transistor. Also, as the floating potential falls on the order of the approximate difference in the threshold voltages of transistors $20_{SDVP}$ and $18_{INVP}$, then the leakage of the LVT transistor $18_{INVP}$ is reduced to approximately that of the HVT transistor $20_{SDVP}$ and, at that point, the potential at node $18_{N3}$ will reach a stable voltage.

The reduced leakage as described above necessarily results in power savings, yet an additional benefit of system 16 arises in its speed of operation and potential data preservation. For example, in system 16, when the discharge transistors are disconnected from ground (i.e., by disabling transistor $20_{SDVN}$), the high threshold voltage behavior that is built into the circuit and the reduced leakage due to the changing $V_{GS}$ as described above permit the voltage at precharge node $18_{PN}$ to remain at or substantially near a solid $V_{DD}$ level, and not at a level differing from $V_{DD}$ by the difference between threshold voltages of the different types of transistors in the circuit. Likewise, when p-channel transistor $18_{INVP}$ is disconnected from $V_{DD}$) by transistor $20_{SDVP}$, the output of inverter $18_{INV}$ as provided at $18_{OUT}$ remains at or substantially near a solid ground level, and not at a level differing from ground by the difference between threshold voltages of the different types of transistors in the circuit. As a result, the state of the circuit remains uncorrupted, and may feed a successive gate. Still further, the combination of the isolation by transistors $20_{SDVP}$ and $20_{SDVN}$ as well as the respective non-enabled transistors having their sources connected to those transistors permits, during the power down mode, the remaining internal capacitive nodes in system 16 to remain at a fixed voltage, or to float by only a minor amount. Thus, when returning to the active mode, there is not a significant delay in restoring the potentials of system 16, and there is considerably less power required as compared to an instance where the nodes discharged and required re-charging. This last point also may be contrasted with the above-described theoretical application of prior art power transistors to dynamic logic, for an instance where a power transistor is connected between $V_{DD}$ and the various transistors requiring $V_{DD}$), and where that power transistor is disabled during a reduced power mode. Particularly, in that application, over time the voltage at tie nodes that are typically connected to $V_{DD}$ but which are disconnected during the reduced power mode may move significantly downward and, indeed, given enough time, will completely discharge. Therefore, when leaving the reduced power mode, a considerable amount of time may be expended in restoring these voltages to the appropriate potentials, and a considerable amount of power is also expended in recharging the discharged node(s). These time and energy expenditures, therefore, are detrimental in the overall performance of the system. Indeed, these expenditures are also somewhat ironic given that the act of disabling the circuit from $V_{DD}$ is an endeavor to save energy, while in fact energy is required to then recharge the circuit after the re-connection of $V_{DD}$. Moreover, if the energy expenditure is significant, then it may not be worthwhile in such an approach t disconnect the $V_{DD}$ supply for a relatively low number of clock cycles. In contrast, the approach of the preferred embodiment does not permit such a dramatic shift in the potential at its node $18_{N1}$ and, thus, overall performance is improved.

Looking now to the active mode of system 16, recall that ENABLE is asserted for that mode and the mode includes both a precharge phase and an evaluate phase. Having described those phases in general with respect to FIG. 1b they are not detailed to the same level as set forth above, but instead the focus is directed to certain additional distinctions and beneficial aspects. During the active mode, the asserted ENABLE signal enables transistor $20_{SDVN}$ which, in response, connects node $18_{N1}$ to ground. At the same time, the complement of ENABLE (i.e., $\overline{\text{ENABLE}}$) enables transistor $20_{SDVP}$, thereby connecting node $18_{N3}$ to $V_{DD}$. With these two transistors enabled, note now that all of the other transistors in system 16 are LVT transistors. This observation is evaluated below as both the precharge and evaluate phase are further explored, again noting that these phases occur during the active mode (i.e., ENABLE asserted).

During the precharge phase, the CLOCK signal is disabling to n-channel discharge transistor $18_{DT}$ and enabling to p-channel precharge transistor $18_{PT}$ (i.e., the CLOCK signal is low). Thus, p-channel precharge transistor $18_{PT}$ causes precharge node $18_{PN}$ to charge toward the precharge voltage, $V_{DD}$. Depending on the values of the INPUTS, a conductive path may be formed through logic circuit $18_L$. Regardless of those values, however, note that the discharge cannot occur from precharge node $18_{PN}$ to ground because n-channel discharge transistor $18_{DT}$ is disabled. Since precharge node $18_{PN}$ charges to $V_{DD}$, this voltage is inverted by inverter $18_{INV}$ and, thus, during the precharge phase, the OUTPUT as provided at $18_{OUT}$ is a logical low. This low signal enables feedback transistor $18_{FBP}$ which operates to further maintain this OUTPUT during the precharge phase.

During the evaluate phase, the CLOCK signal is enabling to n-channel discharge transistor $18_{DT}$ and disabling to p-channel precharge transistor $18_{PT}$ (i.e., the CLOCK signal is high). Further, recall that output $18_{OUT}$ at the end of the precharge phase represents a precharged logic state which, in the example of FIG. 2, is a logic low. However, if a logic equation from logic circuit $18_L$ is such that each transistor realizing a logic equation conducts, then the charge at precharge node $18_{PN}$ is allowed to discharge to ground through the discharge path which includes logic circuit $18_L$, n-channel discharge transistor $18_{DT}$, and transistor $20_{SDVN}$. During this instance, the transistors making up the discharge path may be thought of as resistors. Note, therefore, since all except one of those transistors are LVT transistors, the resistance of each of those transistors is significantly less than the resistance of the HVT transistor $20_{SDVN}$. Since these lower resistances are in series, the overall resistance of the discharge path is reduced as compared to a path which included all HVT transistors. Indeed, note this benefit could be accomplished by having fewer LVT transistors and, thus, even with only one LVT transistor the overall series resistance is still lower than if only HVT transistors were used. In any event, because the overall series resistance is reduced, the time needed to discharge the circuit (and, therefore, change logic state) is reduced as well.

Given the implementation of an active mode and a power down mode in the preferred embodiments using the ENABLE signal and its complement, another aspect in this regard is now explored. Specifically, note during the active mode that CLOCK continuously transitions according to its frequency, and assuming that one or more of the INPUTs is provided by other dynamic logic circuits it is expected that such INPUTs also will transition according to the same frequency. However, in the preferred embodiment, the ENABLE signal is asserted and may be maintained in an asserted state over multiple periods of the CLOCK, that is, it need not transition for each CLOCK cycle during the active mode of operation. By maintaining the ENABLE signal in this manner, there is a reduced overall burden as compared to requiring a frequent upward and downward transition in that signal. In addition, by permitting the ENABLE signal to be maintained over successive cycles, it also may be asserted in anticipation of a period where the active mode is sought; in other words, it may be asserted with a sufficient amount of lead time prior to beginning the active mode (i.e., the time when the CLOCK transitions) so that the operation of transistor $20_{SDVN}$ (and possibly transistor $20_{SDVP}$) is a minimal limitation, if any, in the timing operation of the system. Indeed, note that to further reduce any resistance imposed by transistor $20_{SDVN}$ during the active mode, there is preferably a tradeoff to consider in that its size may be increased to further reduce its resistance, but any such reduction must be weighed against the cost of using additional area on the device to form a larger transistor.

Having explained various benefits of the preferred embodiment and arising from the combination and connection of a system using both HVT and LVT transistors, note that the embodiments described in this document may be constructed in various manners in order to accomplish different transistors having differing threshold voltages. To further demonstrate this aspect, numerous examples are set forth below, while still others may be ascertained by one skilled in the art.

As a first example of creating a system using both HVT and LVT transistors, one manner of accomplishing this goal could be using a manufacturing process which specifically permits the creation of dynamic logic circuits using transistors having differing threshold voltages. For example, in current technology, typically a single semiconductor area (e.g. a wafer) is masked and the exposed areas are exposed to an implant which establishes the threshold voltage for the exposed transistor channels of a first conductivity type. For example, the threshold voltage of all n-channel transistors may be set by using this process, and then repeating it with a different mask set for all p-channel transistors. Thus, using two implant steps, the threshold voltage is set for both n-channel and p-channel transistors. Additionally, for both conductivity types, the depth and/or concentration of the implant used in this manner affects the level of the threshold voltage resulting from the exposure. Under current standards, a common transistor may have a threshold voltage on the order of 500 millivolts. The methodology, however, may be expanded to provide at least two different sets of transistors, where both sets have the same conductivity type but one set includes HVT transistors while the other includes LVT transistors. Using this expanded methodology, and for one conductivity type, a first set of masks could be used to create a set of HVT transistors in the appropriate locations while a second set of masks could be used to create a set of LVT transistors in differing locations. Thus, for a given transistor conductivity types, one implant would take place using the first set of masks to create the HVT transistors. Thereafter, another implant would take place using the second set of masks to create the LVT transistors. Additionally, for a second transistor conductivity type, two more sets of masks and implants would be employed in a like manner. Moreover, to contrast with the 500 millivolt threshold voltage of the HVT transistors, current transistor technology may expect a threshold voltage on the order of 200 millivolts for an LVT transistor. Moreover, these values may vary according to various considerations known in the art. Indeed, another alternative is the use of so-called natural transistors, where no implant is used thereby resulting in yet a different level of threshold voltage.

As a second example of creating a system using both HVT and LVT transistors, some transistors are formed using what is known as silicon-on-insulator ("SOI") technology. In this technology, each SOI transistor includes a separate body connection. Typically, the body is either connected to a certain node, or is allowed to float. The inventor of the present embodiments has further appreciated that this separately-available connection may be further used to accomplish the relative threshold voltage standards set forth in this document, and that additional considerations in this regard may arise in the future once the levels of $V_{DD}$ fall below a diode forward-bias voltage level for such a transistor. Given current $V_{DD}$ levels, which are still considerably higher than a typical forward-bias voltage of about 0.8 volts, and where it is desired to create an LVT configuration, it is acceptable to disconnect the transistor body, thereby allowing it to float. Conversely, given the same $V_{DD}$, and where it is desired to create an HVT configuration, it is acceptable to connect the transistor body to ground for an n-channel transistor (or to $V_{DD}$ for a p-channel transistor). In addition to the above, note that at some point in the future $V_{DD}$ levels should fall to 0.5 volts or less and, therefore, fall considerably below a typical expected forward-bias voltage of 0.8 volts. In this instance, and where it is desired to create an LVT configuration, it will as before be acceptable to disconnect the transistor body, thereby allowing it to float. As a result, the threshold voltage of that transistor during the precharge phase is relatively low. In contrast, where it is desired to create an HVT configuration, the transistor body may be connected to the transistor's gate which is known to be off during the phase in which a high threshold voltage (e.g., during the precharge phase) is desired. For example, for an n-channel SOI transistor connected in this manner, the low gate voltage during precharge is also connected to the body of that transistor. As a result, the threshold voltage of that transistor during the precharge phase is relatively high. Indeed, a relatively higher threshold voltage also may be accomplished by connecting the transistor body to a potential which is non-enabling for the transistor (e.g., connect the body to ground for an n-channel transistor), or to the source of that transistor or to a different signal which is at ground during precharge. Still further with respect to SOI transistors, the threshold voltage also may be adjusted by varying the depth of the depletion layer formed in the body of the device.

As a third example of creating a system using both HVT and LVT transistors, various CMOS designs also may be modified to adjust the threshold voltage of the CMOS transistors. For example, for a p-channel transistor the well of the transistor may be tied to the gate rather than permitting the well to float or connecting it to a fixed potential, where such alternatives may be used to make the transistor relatively an LVT or HVT transistor. to Similarly, some manufacturers now implement triple well technology for n-channel transistors and, given such technology, the well of the n-channel transistor is also available for electrical contact in which case that well also may be made to be either floating, connected to a fixed potential, or connected to the transistor gate in order to adjust the threshold voltage of the device.

As a fourth example of creating a system using both HVT and LVT transistors, note that there are currently manufacturing techniques used in static circuits where certain transistors may be LVT transistors while other transistors may be HVT transistors. In this prior art technique, however, the process is used for static rather than dynamic logic circuits. In addition, the technique is used so that an entire area, such as a set of circuits on an entire circuit die, are constructed using LVT transistors to increase the speed of that set of circuits, but with the recognition that the area constructed in this fashion will have an increased amount of current leakage as compared to the remaining areas on the circuit die which are constructed using HVT transistors. Thus, by modifying this technique or using other techniques available to a person skilled in the art, for purposes of the present embodiments it need be possible that a given circuit may be constructed by intentionally specifying differing threshold voltages for different transistors with the choice of either LVT or HVT transistors within a circuit configuration guided by the embodiments set forth in this document.

Having described the above, one skilled in the art will appreciate the following various observations with respect to the transistors in system 16 that are not selectively disabling voltage transistors; further, these observations be readily applied to create other dynamic logic systems within the present inventive scope. As a first observation, any transistor which is known to have no voltage drop across its source and drain (i.e., to be on) during the power down mode may be made to be an LVT transistor, thereby gaining the advantage of the speed of the LVT device when the circuit returns to the active mode. As a second observation, any transistor which is known to have a voltage drop across its source and drain (i.e., to be off) during the power down mode also may be made to be an LVT transistor, but its source/drain nodes should be isolated from an absolute rail potential (e.g., $V_{DD}$) or ground) via a selectively disabling voltage transistor to thereby minimize any leakage which could otherwise occur due to the use of the LVT transistor. As a third observation, any transistor which may be either on or off during the power down mode also may be made to be an LVT transistor, but again its source/drain nodes should be isolated from an absolute rail potential via a selectively disabling voltage transistor.

Returning now to the ENABLE signal, recall in the preferred embodiment that it is asserted and de-asserted to select the active and power down modes, respectively. In this regard, the ENABLE signal may be generated by various circuits as may be ascertained by one skilled in the art to achieve the proper and desired timing of the active and power down modes. However, with respect to the magnitude of the ENABLE signal, the present inventor has recognized various options. As a first option, the magnitude of the ENABLE signal and its complement may be set equal to the rail supplies for the dynamic logic system to which it is connected. As an example with respect to system 16, the ENABLE signal would be asserted at a level equal to $V_{DD}$ and its complement would be asserted at a level equal to ground. As a second option, however, and as detailed below with respect to FIG. 3, the magnitude of the ENABLE signal may be set to exceed the upper rail supply for the dynamic logic system. This latter option is discussed immediately below, and is shown to further improve the operation of a dynamic logic system such as that shown in FIG. 2 (or as may be applied to other dynamic logic circuits).

Figure 3:
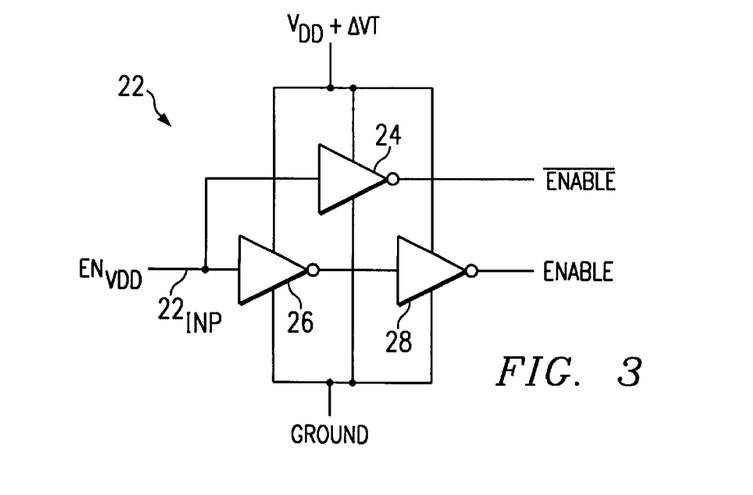
FIG. 3 illustrates an electrical diagram of an inventive control signal system for controlling the high threshold voltage transistors in a dynamic logic circuit such as of the type shown in FIG. 2 for increasing the operational speed of the dynamic logic circuit.

FIG. 3 illustrates a schematic of an ENABLE generation system designated generally at 22. System 22 includes an input $22_{INP}$ for receiving a signal designated $EN_{VDD}$, where $EN_{VDD}$ is intended to operate in the same manner as the ENABLE signal was described above with respect to FIG. 2, that is, $EN_{VDD}$ is asserted when it is desired to place system 16 in an active mode and $EN_{VDD}$ is de-asserted when it is desired to place system 16 in a power down mode. The magnitude of $EN_{VDD}$ merely tracks that of the rail supplies for system 16 and, thus, when asserted it equals $V_{DD}$ and when de-asserted it equals ground (or whatever the relatively lower rail potential is for the dynamic logic system at issue). Input $22_{INP}$ is connected to the input of an inverter 24, where the output of inverter 24 provides the $\overline{ENABLE}$ signal for use with a dynamic logic system such as system 16. Although not expressly shown in FIG. 3, inverter 24 includes sufficient circuitry such as a level translator for reasons detailed below. Input $22_{INP}$ is further connected to the input of an inverter 26, where the output of inverter 26 is connected to the input of an inverter 28 and where inverter 26 also includes a level translator or comparable circuitry. The output of inverter 28 provides the ENABLE signal for use with a dynamic logic system such as system 16. Importantly for purposes of the present aspect, note that each of inverters 24, 26, and 28 is biased by a voltage swing greater than the rail supplies of system 16. More specifically, in the preferred embodiment, the upper supply voltage for system 22 is greater than the upper supply for system 16 (i.e., $V_{DD}$), while the lower supply voltage for system 22 is the lower supply for system 16 (i.e., ground). Moreover, in the preferred embodiment, the upper supply for system 22 differs from the respective supply of system 16 by an amount designated "$\Delta VT$", where $\Delta VT$ represents the difference in threshold voltage between the HVT and LVT transistors of system 16. For example, the typical difference in contemporary circuits may be 300 millivolts, in which case the upper supply in system 22 equals $V_{DD}$+300 millivolts.

The operation of system 22 is as follows. When $EN_{VDD}$ is asserted, inverter 24 inverts this signal and asserts $\overline{ENABLE}$; moreover, because $\overline{ENABLE}$ is output by inverter 24, and because inverter 24 is biased at a lower potential of ground, then the magnitude of $\overline{ENABLE}$ also equals ground. Accordingly, the gate potential applied to p-channel transistor $20_{SDVP}$ of system 16 equals ground. In a complementary sense and also when $EN_{VDD}$ is asserted, the dual inversion path of inverters 26 and 28 assert ENABLE; however, because inverters 26 and 28 are biased at upper potentials equal to $V_{DD}$+$\Delta VT$ and given the level translator included within inverter 26, then the magnitude of ENABLE equals $V_{DD}$+$\Delta VT$. Accordingly, the gate potential applied to n-channel transistor $20_{SDVN}$ of system 16 equals $V_{DD}$+$\Delta VT$ and, hence, is $\Delta VT$ greater than the high supply voltage for system 16. Lastly, and given the above, note the resulting opposite outputs when $EN_{VDD}$ is not asserted, that is, in this latter case, inverter 24 outputs $\overline{ENABLE}$ at a voltage equal to $V_{DD}$+$\Delta VT$ using its level translator while ENABLE equals ground. The effects of these different voltage signals are explored below.

Turning to the active mode of operation, recall that ENABLE (and its complement) is asserted during that mode. Moreover, system 22 has now been shown to provide ENABLE at a value that is $\Delta VT$ greater than the upper rail supply in system 16. The result of this approach, therefore, increases the $V_{GS}$ applied to the n-channel selectively disabling voltage transistor $20_{SDVN}$ as compared to the earlier discussion. More particularly, in this case the gate potential to transistor $20_{SDVN}$ is increased by an amount of $\Delta VT$ over $V_{DD}$. In effect, therefore, n-channel transistor $20_{SDVN}$ is able to conduct more current than if it were merely biased with a voltage equal to $V_{DD}$. Indeed, because the relative increase to the gate of n-channel transistor $20_{SDVN}$ equals $\Delta VT$, then given this added gate bias transistor $20_{SDVN}$ is able to conduct approximately the same level of current that is achieved by its LVT counterpart(s) in system 16 (e.g., transistor $18_{DT}$). Accordingly, during the active mode of operation, the operational speed of the HVT transistor $20_{SDVN}$ will approximate that of an LVT device.

Looking at the power down mode of operation, recall that ENABLE is de-asserted during that mode. As a result, a ground potential is connected to the gate of n-channel selectively disabling voltage transistor $20_{SDVN}$ and it is disabled, thereby limiting current leakage in a favorable manner due to its HVT characteristics. In addition during the power down mode, $\overline{ENABLE}$ outputs at a voltage equal to $V_{DD}$+$\Delta VT$ to the gate of p-channel selectively disabling voltage transistor $20_{SDVP}$. Thus, system 22 decreases the $V_{GS}$ of p-channel transistor $20_{SDVP}$ by an amount of $\Delta VT$ more than $V_{DD}$, that is, it renders the $V_{GS}$ of that transistor even more negative than in the case that a voltage of $V_{DD}$ were applied to the transistor gate. In effect, therefore, p-channel transistor $20_{SDVP}$ is turned off to an even greater extreme than if $V_{DD}$ were coupled to its gate at this time and, hence, its current limiting ability is further enhanced. Indeed, for this reason this enhancement of the current limiting ability may give rise to additional embodiments as detailed below.

The preceding alternatives for driving the ENABLE signal give rise to still additional considerations within the present inventive scope as pertaining to p-channel transistor $20_{SDVP}$. Reviewing the above, it has been shown that in one embodiment transistor $20_{SDVP}$ is an HVT transistor, and its ENABLE gate control signals are either at ground or $V_{DD}$. This approach, for example, may be readily usable in instances where supply voltages are relatively large given contemporary standards, such as on the order of 1.8 volts. In another embodiment, however, transistor $20_{SDVP}$ is an LVT transistor, and its ENABLE gate control signals are either at ground or $V_{DD}$ plus some additional voltage. This approach, for example, may be readily usable in instances where supply voltages are relatively lower given contemporary standards, such as on the order of 1.0, 0.75, or even 0.5 volts. These approaches lead to still additional embodiments whereby the threshold voltage of transistor $20_{SDVP}$ is reduced from that of an HVT transistor, as explained below.

Turning now to additional considerations regarding the threshold voltage of p-channel transistor $20_{SDVP}$, recall from above that when it is driven with an ENABLE signal equal to $V_{DD}+\Delta VT$, and where $\Delta VT$ equals the difference in threshold voltage for an HVT and LVT p-channel transistor, then p-channel transistor $20_{SDVP}$ is driven off to an even greater extent than if it were driven only with $V_{DD}$. Note further, however, that in some instances there may be a second signal level that is accessible and is greater than $V_{DD}$ by an amount larger than that described for $\Delta VT$. For example, in many contemporary systems, the I/O voltage levels are larger than the internal supply levels; for example, some current systems use an external I/O voltage level of 3.3 volts and an internal $V_{DD}$ equal to 1.8 volts. In this or other instances, as an alternative embodiment a voltage larger than $V_{DD}+\Delta VT$ may be used to drive the gate of p-channel transistor $20_{SDVP}$ when disabling that transistor and, as a result, the drive voltage would be significantly greater than $V_{DD}+\Delta VT$ voltage where $\Delta VT$ equals the difference in threshold voltage for an HVT and LVT transistor. When this even larger drive voltage is used to drive the gate of p-channel transistor $20_{SDVP}$, then its current limiting capability is further increased. In any case, the preceding has provided alternatives for driving p-channel transistor $20_{SDVP}$ to further limit its current leakage when it is disabled. As a result, if one of these alternatives is selected, and it is therefore known that p-channel transistor $20_{SDVP}$ will provide a sufficient limit on current leakage, then in another embodiment it may well be that its threshold voltage may be reduced so that when it is enabled it provides a larger drive current and thereby increases the speed of system 16. Thus, using one of the many techniques set forth above for producing an LVT transistor, in one embodiment the threshold voltage of p-channel transistor $20_{SDVP}$ is adjusted to have a threshold voltage on the order of other p-channel LVT transistors in system 16. Still further, in yet another embodiment the threshold voltage of p-channel transistor $20_{SDVP}$ is adjusted to have a threshold voltage lower than that of other p-channel LVT transistors in system 16, such as by making p-channel transistor $20_{SDVP}$ a natural transistor or by adjusting its threshold voltage using any one of the various techniques described above for making such an adjustment. Further in this regard, note that if p-channel transistor $20_{SDVP}$ is formed as a natural transistor, then it will conduct more current (i.e., have lower resistance) than the other LVT transistors in system 16; as a result, this lower current may used at its full level, or if a lesser amount of current is still usable at a desirable level, then the natural transistor may be made to be a smaller size, thereby driving less current but still providing an enhanced level of current drive relative to an HVT alternative.

The preceding alternatives for driving the ENABLE signal also give rise to an additional consideration within the present inventive scope as pertaining to n-channel transistor $20_{SDVN}$. Specifically, the above discussion demonstrates instances where the drive voltage to p-channel transistor $20_{SDVP}$ is greater than $V_{DD}+\Delta VT$, and in such an instance that same drive voltage may be used to drive the gate of n-channel transistor $20_{SDVN}$. In this case, because n-channel transistor $20_{SDVN}$ is an HVT transistor and thereby limits current leakage when it is disabled, it also may be modified for the instance when it is enabled. More particularly, to optimize its performance in system 16 while it is enabled transistor $20_{SDVN}$ may be made smaller as compared to the case when it is driven with a lesser voltage, because despite being made smaller the larger drive voltage to its gate will still permit it to drive a sufficient amount of current so as not to unduly restrict the speed of system 16.

From the above, it may be appreciated that the above embodiments provide numerous advantages over the prior art. For example, current leakage is reduced while logic transition speed is increased. Further, there is not as significant a concern with the drawback of the prior art where reducing current leakage necessarily penalized speed. Moreover, while the present embodiments have been shown by way of example, their application span a wide range of examples whereby a person skilled in the art may readily apply the above to still further embodiments not specifically shown above, including domino logic circuits that are not hold time latches. Still further, various changes are also clearly within the present inventive scope as may be ascertained by one skilled in the art. or example, voltage levels and conductivity types have only been shown by way of example and may be changed. As another example, while the preferred embodiment uses LVT transistors for all transistors other than the selectively disabling voltage transistors, other embodiments may be formed using fewer LVT or additional HVT devices. Consequently, while the present embodiments have been described in detail, various substitutions, modifications or alterations could be made to the descriptions set forth above without departing from the inventive scope which is defined by the claims set forth below.

What is claimed is:

1. A dynamic logic circuit coupled between an upper supply voltage and a lower supply voltage and operable in an active mode and in a power down mode, wherein the active mode comprises a precharge phase and an evaluate phase, the circuit comprising:

a precharge node coupled to be precharged to a precharge voltage during the precharge phase and operable to be discharged during the evaluate phase;

a conditional series discharge path connected to the precharge node and comprising a plurality of transistors operable to conditionally couple the precharge node to a voltage different than the precharge voltage;

an output inverter having an input connected to the precharge node and comprising a plurality of transistors for providing an output signal representative of a voltage at the precharge node during the evaluate phase; and a precharge transistor to be enabled during the power down mode and having a source/drain conductive path for coupling the precharge voltage to the precharge node during the precharge phase;

wherein, during the power down mode, at least one transistor in a first set of selected ones of the precharge transistor, the transistors of the conditional series path, and the transistors of the output inverter has a source/drain node connected to the upper supply voltage;

wherein, during the power down mode, at least one transistor in a second set of selected ones of the precharge transistor, the transistors of the conditional series path, and the transistors of the output inverter has a source/drain node connected to the lower supply voltage;

wherein, during the power down mode, at least one transistor in a third set of selected ones of the precharge transistor, the transistors of the conditional series path, and the transistors of the output inverter has a source/drain node selectively disabled from either of the upper supply voltage and the lower supply voltage;

wherein selected ones of the precharge transistor, the transistors of the conditional series path, and the transistors of the output inverter have a threshold voltage selected based on whether the corresponding transistor is always enabled during the power down mode; and wherein for a group of those transistors that are always enabled during the power down mode each such transistor has a threshold voltage that is relatively lower than another one of the transistors in the dynamic logic circuit having a same conductivity type.

2. The dynamic logic circuit of claim 1 wherein at least one or more transistors in the group of the transistors has a source/drain node connected to one of the upper supply voltage and the lower supply voltage.

3. A dynamic logic circuit coupled between an upper supply voltage and a lower supply voltage and operable in an active mode and in a power down mode, wherein the active mode comprises a precharge phase and an evaluate phase, the circuit comprising:

a precharge node coupled to be precharged to a precharge voltage during the precharge phase and operable to be discharged during the evaluate phase;

a conditional series discharge path connected to the precharge node and comprising a plurality of transistors operable to conditionally couple the precharge node to a voltage different than the precharge voltage;

an output inverter having an input connected to the precharge node and comprising a plurality of transistors for providing an output signal representative of a voltage at the precharge node during the evaluate phase; and a precharge transistor to be enabled during the power down mode and having a source/drain conductive path for coupling the precharge voltage to the precharge node during the precharge phase;

wherein, during the power down mode, at least one transistor in a first set of selected ones of the precharge transistor, the transistors of the conditional series path, and the transistors of the output inverter has a source/drain node connected to the upper supply voltage;

wherein, during the power down mode, at least one transistor in a second set of selected ones of the precharge transistor, the transistors of the conditional series path, and the transistors of the output inverter has a source/drain node connected to the lower supply voltage;

wherein, during the power down mode, at least one transistor in a third set of selected ones of the precharge transistor, the transistors of the conditional series path, and the transistors of the output inverter has a source/drain node selectively disabled from either of the upper supply voltage and the lower supply voltage;

wherein selected ones of the precharge transistor, the transistors of the conditional series path, and the transistors of the output inverter have a threshold voltage selected based on whether the corresponding transistor is always enabled during the power down mode; and wherein for a group of those transistors that are always disabled during the power down mode each such transistor has a threshold voltage that is relatively lower than another one of the transistors in the dynamic logic circuit having a same conductivity type.

4. The dynamic logic circuit of claim 3 wherein at least one or more transistors in the group of the transistors has a source/drain node selectively disabled from either of the upper supply voltage and the lower supply voltage during the power down mode.

5. A dynamic logic circuit coupled between an upper supply voltage and a lower supply voltage and operable in an active mode and in a power down mode, wherein the active mode comprises a precharge phase and an evaluate phase, the circuit comprising:

a precharge node coupled to be precharged to a precharge voltage during the precharge phase and operable to be discharged during the evaluate phase;

a conditional series discharge path connected to the precharge node and comprising a plurality of transistors operable to conditionally couple the precharge node to a voltage different than the precharge voltage;

an output inverter having an input connected to the precharge node and comprising a plurality of transistors for providing an output signal representative of a voltage at the precharge node during the evaluate phase; and a precharge transistor to be enabled during the power down mode and having a source/drain conductive path for coupling the precharge voltage to the precharge node during the precharge phase;

wherein, during the power down mode, at least one transistor in a first set of selected ones of the precharge transistor, the transistors of the conditional series path, and the transistors of the output inverter has a source/drain node connected to the upper supply voltage;

wherein, during the power down mode, at least one transistor in a second set of selected ones of the precharge transistor, the transistors of the conditional series path, and the transistors of the output inverter has a source/drain node connected to the lower supply voltage;

wherein, during the power down mode, at least one transistor in a third set of selected ones of the precharge transistor, the transistors of the conditional series path, and the transistors of the output inverter has a source/drain node selectively disabled from either of the upper supply voltage and the lower supply voltage;

wherein selected ones of the precharge transistor, the transistors of the conditional series path, and the transistors of the output inverter have a threshold voltage selected based on whether the corresponding transistor is always enabled during the power down mode; and wherein for a group of those transistors for which it is unknown whether each transistor in the group is always enabled during the power down mode each such transistor has a threshold voltage that is relatively lower than another one of the transistors in the dynamic logic circuit having a same conductivity type.

6. The dynamic logic circuit of claim 5 wherein at least one or more transistors in the group of the transistors has a source/drain node selectively disabled from either of the upper supply voltage and the lower supply voltage during the power down mode.

7. A dynamic logic circuit coupled between an upper supply voltage and a lower supply voltage and operable in an active mode and in a power down mode, wherein the active mode comprises a precharge phase and an evaluate phase, the circuit comprising:

- a precharge node coupled to be precharged to a precharge voltage during the precharge phase and operable to be discharged during the evaluate phase;
- a conditional series discharge path connected to the precharge node and comprising a plurality of transistors operable to conditionally couple the precharge node to a voltage different than the precharge voltage;
- an output inverter having an input connected to the precharge node and comprising a plurality of transistors for providing an output signal representative of a voltage at the precharge node during the evaluate phase;
- a precharge transistor to be enabled during the power down mode and having a source/drain conductive path for coupling the precharge voltage to the precharge node during the precharge phase; and
- a selectively disabling transistor operable to be disabled during the power down mode and having a source/drain node connected to receive the upper supply voltage and having a source/drain node for providing a selectively disabled upper reference potential, wherein the selectively disabling transistor has a threshold voltage that is relatively higher than another one of the transistors in the dynamic logic circuit having a same conductivity type;
- wherein, during the power down mode, at least one transistor in a first set of selected ones of the precharge transistor, the transistors of the conditional series path, and the transistors of the output inverter has a source/drain node connected to the upper supply voltage;
- wherein, during the power down mode, at least one transistor in a second set of selected ones of the precharge transistor, the transistors of the conditional series path, and the transistors of the output inverter has a source/drain node connected to the lower supply voltage;
- wherein, during the power down mode, at least one transistor in a third set of selected ones of the precharge transistor, the transistors of the conditional series path, and the transistors of the output inverter has a source/drain node selectively disabled from either of the upper supply voltage and the lower supply voltage; and
- wherein the plurality of transistors of the output inverter comprises a first output transistor having a source/drain node connected to receive the selectively disabled upper reference potential and having a threshold voltage lower than that of the first selectively disabling transistor.

8. A dynamic logic circuit coupled between an upper supply voltage and a lower supply voltage and operable in an active mode and in a power down mode, wherein the active mode comprises a precharge phase and an evaluate phase, the circuit comprising:

- a precharge node coupled to be precharged to a precharge voltage during the precharge phase and operable to be discharged during the evaluate phase;
- a conditional series discharge path connected to the precharge node and comprising a plurality of transistors operable to conditionally couple the precharge node to a voltage different than the precharge voltage;
- an output inverter having an input connected to the precharge node and comprising a plurality of transistors for providing an output signal representative of a voltage at the precharge node during the evaluate phase; and
- a precharge transistor to be enabled during the power down mode and having a source/drain conductive path for coupling the precharge voltage to the precharge node during the precharge phase;
- wherein, during the power down mode, at least one transistor in a first set of selected ones of the precharge transistor, the transistors of the conditional series path, and the transistors of the output inverter has a source/drain node connected to the upper supply voltage;
- wherein, during the power down mode, at least one transistor in a second set of selected ones of the precharge transistor, the transistors of the conditional series path, and the transistors of the output inverter has a source/drain node connected to the lower supply voltage;
- wherein, during the power down mode, at least one transistor in a third set of selected ones of the precharge transistor, the transistors of the conditional series path, and the transistors of the output inverter has a source/drain node selectively disabled from either of the upper supply voltage and the lower supply voltage;
- further comprising a selectively disabling transistor operable to be disabled during the power down mode and having a source/drain node connected to receive the upper supply voltage and having a source/drain node for providing a selectively disabled upper reference potential, wherein the selectively disabling transistor has a threshold voltage that is relatively higher than another one of the transistors in the dynamic logic circuit having a same conductivity type; and
- further comprising a feedback transistor having a source/drain node connected to receive the upper supply voltage, a gate connected to receive the output signal, and a source/drain node coupled to the input of the inverter, and having a threshold voltage lower than that of the first selectively disabling transistor.

9. A dynamic logic circuit coupled between an upper supply voltage and a lower supply voltage and operable in an active mode and in a power down mode, wherein the active mode comprises a precharge phase and an evaluate phase, the circuit comprising:

- a precharge node coupled to be precharged to a precharge voltage during the precharge phase and operable to be discharged during the evaluate phase;
- a conditional series discharge path connected to the precharge node and comprising a plurality of transistors operable to conditionally couple the precharge node to a voltage different than the precharge voltage;
- an output inverter having an input connected to the precharge node and comprising a plurality of transistors for providing an output signal representative of a voltage at the precharge node during the evaluate phase; and a precharge transistor to be enabled during the power down mode and having a source/drain conductive path for coupling the precharge voltage to the precharge node during the precharge phase;

wherein, during the power down mode, at least one transistor in a first set of selected ones of the precharge transistor, the transistors of the conditional series path, and the transistors of the output inverter has a source/drain node connected to the upper supply voltage;

wherein, during the power down mode, at least one transistor in a second set of selected ones of the precharge transistor, the transistors of the conditional series path, and the transistors of the output inverter has a source/drain node connected to the lower supply voltage;

wherein, during the power down mode, at least one transistor in a third set of selected ones of the precharge transistor, the transistors of the conditional series path, and the transistors of the output inverter has a source/drain node selectively disabled from either of the upper supply voltage and the lower supply voltage;

further comprising a selectively disabling transistor operable to be disabled during the power down mode and having a source/drain node connected to receive the upper supply voltage and having a source/drain node for providing a selectively disabled upper reference potential, wherein the selectively disabling transistor has a threshold voltage that is relatively higher than another one of the transistors in the dynamic logic circuit having a same conductivity type; and wherein the plurality of transistors of the output inverter comprises a first output transistor having a source/drain node connected to receive the selectively disabled upper reference potential and having a threshold voltage lower than that of the first selectively disabling transistor; and further comprising a feedback transistor having a source/drain node connected to receive the upper supply voltage, a gate connected to receive the output signal, and a source/drain node coupled to the input of the inverter, and having a threshold voltage lower than that of the first selectively disabling transistor.

10. A dynamic logic circuit coupled between an upper supply voltage and a lower supply voltage and operable in an active mode and in a power down mode, wherein the active mode comprises a precharge phase and an evaluate phase, the circuit comprising:

a precharge node coupled to be precharged to a precharge voltage during the precharge phase and operable to be discharged during the evaluate phase;

a conditional series discharge path connected to the precharge node and comprising a plurality of transistors operable to conditionally couple the precharge node to a voltage different than the precharge voltage;

an output inverter having an input connected to the precharge node and comprising a plurality of transistors for providing an output signal representative of a voltage at the precharge node during the evaluate phase; and a precharge transistor to be enabled during the power down mode and having a source/drain conductive path for coupling the precharge voltage to the precharge node during the precharge phase;

wherein, during the power down mode, at least one transistor in a first set of selected ones of the precharge transistor, the transistors of the conditional series path, and the transistors of the output inverter has a source/drain node connected to the upper supply voltage;

wherein, during the power down mode, at least one transistor in a second set of selected ones of the precharge transistor, the transistors of the conditional series path, and the transistors of the output inverter has a source/drain node connected to the lower supply voltage;

wherein, during the power down mode, at least one transistor in a third set of selected ones of the precharge transistor, the transistors of the conditional series path, and the transistors of the output inverter has a source/drain node selectively disabled from either of the upper supply voltage and the lower supply voltage;

a first selectively disabling transistor operable to be disabled during the power down mode and having a source/drain node connected to receive the upper supply voltage and having a source/drain node for providing a selectively disabled upper reference potential, wherein the first selectively disabling transistor has a threshold voltage that is relatively higher than another one of the transistors in the dynamic logic circuit having a same conductivity type; and a second selectively disabling transistor operable to be disabled during the power down mode and having a source/drain node connected to receive the lower supply voltage and having a source/drain node for providing a selectively disabled lower reference potential, wherein the second selectively disabling transistor has a threshold voltage that is relatively higher than another one of the transistors in the dynamic logic circuit having a same conductivity type.

11. The dynamic logic circuit of claim 10 and further comprising:

a first feedback transistor having a source/drain node connected to receive the upper supply voltage, a gate connected to receive the output signal, and a source/drain node coupled to the input of the inverter, and having a threshold voltage lower than that of the first selectively disabling transistor; and a second feedback transistor having a source/drain node connected to receive the selectively disabled lower reference potential, a gate connected to receive the output signal, and a source/drain node coupled to the input of the inverter, and having a threshold voltage lower than that of the second selectively disabling transistor.

12. The dynamic logic circuit of claim 10:

wherein each of the precharge transistor, the transistors of the conditional series path, and the transistors of the output inverter has a source/drain conductive path operable to receive a voltage difference between the upper supply voltage and the lower supply voltage; and further comprising circuitry for providing gate control signals to the first selectively disabling transistor, wherein one of the gate control signals is for disabling the first selectively disabling transistor and is greater than the upper supply voltage.

13. The dynamic logic circuit of claim 12 wherein the first selectively disabling transistor has a threshold voltage that is relatively lower than another transistor in the dynamic logic circuit having a same conductivity type.

14. The dynamic logic circuit of claim 13 and further comprising a feedback transistor having a source/drain node connected to receive the upper supply voltage, a gate connected to receive the output signal, and a source/drain node coupled to the input of the inverter.

15. The dynamic logic circuit of claim 12 wherein the first selectively disabling transistor comprises a natural transistor.

16. The dynamic logic circuit of claim 10:
  wherein each of the precharge transistor, the transistors of the conditional series path, and the transistors of the output inverter has a source/drain conductive path operable to receive a voltage difference between the upper supply voltage and the lower supply voltage; and
  further comprising circuitry for providing gate control signals to the second selectively disabling transistor, wherein one of the gate control signals is for enabling the second selectively disabling transistor and is greater than the upper supply voltage.

17. The dynamic logic circuit of claim 10:
  wherein each of the precharge transistor, the transistors of the conditional series path, and the transistors of the output inverter has a source/drain conductive path operable to receive a voltage difference between the upper supply voltage and the lower supply voltage; and
  further comprising:
    circuitry for providing gate control signals to the first selectively disabling transistor, wherein one of the gate control signals is for disabling the first selectively disabling transistor and is greater than the upper supply voltage; and
    circuitry for providing gate control signals to the second selectively disabling transistor, wherein one of the gate control signals is for enabling the second selectively disabling transistor and is greater than the upper supply voltage.

18. The dynamic logic circuit of claim 17 wherein a voltage difference between the one of the gate control signals for enabling the second selectively disabling transistor and the upper supply voltage equals a difference between the threshold voltage of the second selectively disabling transistor and the threshold voltage of the at least some of those transistors that are always enabled during the power down mode and have a same conductivity type as the second selectively disabling transistor.

19. The dynamic logic circuit of claim 17 wherein a voltage difference between the one of the gate control signals for disabling the first selectively disabling transistor and the upper supply voltage equals a difference between the threshold voltage of the first selectively disabling transistor and the threshold voltage of the at least some of those transistors that are always enabled during the power down mode and have a same conductivity type as the first selectively disabling transistor.

20. The dynamic logic circuit of claim 17:
  wherein a voltage difference between the one of the gate control signals for enabling the second selectively disabling transistor and the upper supply voltage equals a difference between the threshold voltage of the second selectively disabling transistor and the threshold voltage of the at least some of those transistors that are always enabled during the power down mode and have a same conductivity type as the second selectively disabling transistor; and
  wherein a voltage difference between the one of the gate control signals for disabling the first selectively disabling transistor and the upper supply voltage equals a difference between the threshold voltage of the first selectively disabling transistor and the threshold voltage of the at least some of those transistors that are always enabled during the power down mode and have a same conductivity type as the first selectively disabling transistor.

21. A dynamic logic circuit coupled between an upper supply voltage and a lower supply voltage and operable in an active mode and in a power down mode, wherein the active mode comprises a precharge phase and an evaluate phase, the circuit comprising:
  a precharge node coupled to be precharged to a precharge voltage during the precharge phase and operable to be discharged during the evaluate phase;
  a conditional series discharge path connected to the precharge node and comprising a plurality of transistors operable to conditionally couple the precharge node to a voltage different than the precharge voltage;
  an output inverter having an input connected to the precharge node and comprising a plurality of transistors for providing an output signal representative of a voltage at the precharge node during the evaluate phase; and
  a precharge transistor to be enabled during the power down mode and having a source/drain conductive path for coupling the precharge voltage to the precharge node during the precharge phase;
  wherein, during the power down mode, at least one transistor in a first set of selected ones of the precharge transistor, the transistors of the conditional series path, and the transistors of the output inverter has a source/drain node connected to the upper supply voltage;
  wherein, during the power down mode, at least one transistor in a second set of selected ones of the precharge transistor, the transistors of the conditional series path, and the transistors of the output inverter has a source/drain node connected to the lower supply voltage;
  wherein, during the power down mode, at least one transistor in a third set of selected ones of the precharge transistor, the transistors of the conditional series path, and the transistors of the output inverter has a source/drain node selectively disabled from either of the upper supply voltage and the lower supply voltage;
  wherein selected ones of the precharge transistor, the transistors of the conditional series path, and the transistors of the output inverter have a threshold voltage selected based on whether the corresponding transistor is always enabled during the power down mode;
  wherein for a group of those transistors that are always enabled during the power down mode each such transistor has a threshold voltage that is relatively lower than another one of the transistors in the dynamic logic circuit having a same conductivity type;
  wherein for a group of those transistors that are always disabled during the power down mode each such transistor has a threshold voltage that is relatively lower than another one of the transistors in the dynamic logic circuit having a same conductivity type; and
  wherein for a group of those transistors for which it is unknown whether each transistor in the group is always enabled during the power down mode each such transistor has a threshold voltage that is relatively lower than another one of the transistors in the dynamic logic circuit having a same conductivity type.

22. A dynamic logic circuit coupled between an upper supply voltage and a lower supply voltage and operable in an active mode and in a power down mode, wherein the active mode comprises a precharge phase and an evaluate phase, the circuit comprising:
- a precharge node coupled to be precharged to a precharge voltage during the precharge phase and operable to be discharged during the evaluate phase;
- a conditional series discharge path connected to the precharge node and comprising a plurality of transistors operable to conditionally couple the precharge node to a voltage different than the precharge voltage;
- an output inverter having an input connected to the precharge node and comprising a plurality of transistors for providing an output signal representative of a voltage at the precharge node during the evaluate phase; and
- a precharge transistor to be enabled during the power down mode and having a source/drain conductive path for coupling the precharge voltage to the precharge node during the precharge phase;
- wherein, during the power down mode, at least one transistor in a first set of selected ones of the precharge transistor, the transistors of the conditional series path, and the transistors of the output inverter has a source/drain node connected to the upper supply voltage;
- wherein, during the power down mode, at least one transistor in a second set of selected ones of the precharge transistor, the transistors of the conditional series path, and the transistors of the output inverter has a source/drain node connected to the lower supply voltage;
- wherein, during the power down mode, at least one transistor in a third set of selected ones of the precharge transistor, the transistors of the conditional series path, and the transistors of the output inverter has a source/drain node selectively disabled from either of the upper supply voltage and the lower supply voltage;
- wherein selected ones of the precharge transistor, the transistors of the conditional series path, and the transistors of the output inverter have a threshold voltage that is relatively lower than another one of the transistors in the dynamic logic circuit having a same conductivity type; and
- wherein the selected ones are formed using a first implantation step and wherein the another one is formed using a second implantation step at a time different than the first implantation step.

23. A dynamic logic circuit coupled between an upper supply voltage and a lower supply voltage and operable in an active mode and in a power down mode, wherein the active mode comprises a precharge phase and an evaluate phase, the circuit comprising:
- a precharge node coupled to be precharged to a precharge voltage during the precharge phase and operable to be discharged during the evaluate phase;
- a conditional series discharge path connected to the precharge node and comprising a plurality of transistors operable to conditionally couple the precharge node to a voltage different than the precharge voltage;
- an output inverter having an input connected to the precharge node and comprising a plurality of transistors for providing an output signal representative of a voltage at the precharge node during the evaluate phase; and
- a precharge transistor to be enabled during the power down mode and having a source/drain conductive path for coupling the precharge voltage to the precharge node during the precharge phase;
- wherein, during the power down mode, at least one transistor in a first set of selected ones of the precharge transistor, the transistors of the conditional series path, and the transistors of the output inverter has a source/drain node connected to the upper supply voltage;
- wherein, during the power down mode, at least one transistor in a second set of selected ones of the precharge transistor, the transistors of the conditional series path, and the transistors of the output inverter has a source/drain node connected to the lower supply voltage;
- wherein, during the power down mode, at least one transistor in a third set of selected ones of the precharge transistor, the transistors of the conditional series path, and the transistors of the output inverter has a source/drain node selectively disabled from either of the upper supply voltage and the lower supply voltage;
- wherein selected ones of the precharge transistor, the transistors of the conditional series path, and the transistors of the output inverter have a threshold voltage that is relatively lower than another one of the transistors in the dynamic logic circuit having a same conductivity type; and
- wherein the selected ones comprise a silicon-on-insulator transistor comprising a body connection, and wherein the body connection of the selected ones floats; and
- wherein the another one comprise a silicon-on-insulator transistor comprising a body connection and a gate, and wherein the body connection of the another one is connected to the gate.

24. A dynamic logic circuit coupled between an upper supply voltage and a lower supply voltage and operable in an active mode and in a power down mode, wherein the active mode comprises a precharge phase and an evaluate phase, the circuit comprising:
- a precharge node coupled to be precharged to a precharge voltage during the precharge phase and operable to be discharged during the evaluate phase;
- a conditional series discharge path connected to the precharge node and comprising a plurality of transistors operable to conditionally couple the precharge node to a voltage different than the precharge voltage;
- an output inverter having an input connected to the precharge node and comprising a plurality of transistors for providing an output signal representative of a voltage at the precharge node during the evaluate phase; and
- a precharge transistor to be enabled during the power down mode and having a source/drain conductive path for coupling the precharge voltage to the precharge node during the precharge phase;
- wherein, during the power down mode, at least one transistor in a first set of selected ones of the precharge transistor, the transistors of the conditional series path, and the transistors of the output inverter has a source/drain node connected to the upper supply voltage;
- wherein, during the power down mode, at least one transistor in a second set of selected ones of the precharge transistor, the transistors of the conditional series path, and the transistors of the output inverter has a source/drain node connected to the lower supply voltage;
- wherein, during the power down mode, at least one transistor in a third set of selected ones of the precharge transistor, the transistors of the conditional series path, and the transistors of the output inverter has a source/drain node selectively disabled from either of the upper supply voltage and the lower supply voltage;

wherein the output inverter comprises:

an n-channel transistor having a source connected to the lower supply voltage, a gate coupled to the input of the output inverter, and a drain for providing the output signal;

a first p-channel transistor having a drain for providing the output signal, a gate coupled to the input of the output inverter; and a second p-channel transistor having a source connected to a drain of the first p-channel and a drain connected to the upper supply voltage, wherein during the power down mode the second p-channel transistor has a lower leakage characteristic than the first p-channel transistor.

25. A dynamic logic circuit coupled between an upper supply voltage and a lower supply voltage and operable in an active mode and in a power down mode, wherein the active mode comprises a precharge phase and an evaluate phase, the circuit comprising:

a plurality of dynamic logic subcircuits, each subcircuit including
- a precharge node coupled to be precharged to said upper supply voltage during the precharge phase and operable to be discharged during the evaluate phase;
- a P-channel precharge transistor having a source/drain conductive path connected between said upper supply voltage and said precharge node and a gate receiving a clock signal;
- a conditional series discharge path having a first terminal connected to the precharge node, a second terminal and including at least one logic input, said conditional series discharge path comprising a plurality of transistors operable to conditionally couple said first terminal and said second terminal dependent upon said at least one logic input;
- an N-channel discharge transistor having a source/drain conduction path connected between said second node of said conditional series discharge path and a first enable node and a gate receiving said clock signal;
- an output inverter including
  - a P-channel output inverter transistor having a source/drain conduction path connected between a second enable node and a output node forming an output of said subcircuit and a gate connected to said precharge node,
  - an N-channel output inverter transistor having a source/drain conduction path connected between said output node and said lower supply voltage and a gate connected to said precharge node;
an N-channel enable transistor having a source/drain conduction path connected between said first enable node of each of said plurality of subcircuits and said lower supply voltage and a gate receiving an enable signal; and
a P-channel enable transistor having a source/drain conduction path connected between said upper power supply and said second enable node of each of said plurality of subcircuits and a gate receiving an inverse enable signal.

26. The dynamic logic circuit of claim 25, wherein:

said P-channel precharge transistor, each transistor of said conditional series discharge path, said N-channel discharge transistor, said P-channel output inverter transistor and said N-channel output inverter transistor of each subcircuit has a first threshold voltage; and said N-channel enable transistor and said P-channel enable transistor each have a second threshold voltage greater than said first threshold voltage.

27. The dynamic logic circuit of claim 25, wherein:

said clock signal periodically and repeatedly cycles between said upper supply voltage and said lower supply voltage, whereby said P-channel precharge transistor is enabled for said precharge phase when said clock signal has said lower supply voltage and said N-channel discharge transistor is enabled for said evaluate phase when said clock signal has said lower supply voltage; and said enable signal has an enable voltage greater than said upper supply voltage to enable each of said subcircuits and a voltage equal to said lower supply voltage to disable said subcircuits.

* * * * *